(12) United States Patent
Lien et al.

(10) Patent No.: US 9,692,471 B2
(45) Date of Patent: Jun. 27, 2017

(54) WIRELESS RECEIVER WITH HIGH LINEARITY

(71) Applicant: MediaTek Singapore Pte. Ltd., Singapore (SG)

(72) Inventors: Yuan-Ching Lien, Taipei (TW); Bernard Mark Tenbroek, Kent (GB); Eric Klumperink, Enschede (NL); Bram Nauta, Enschede (NL)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/993,325

(22) Filed: Jan. 12, 2016

(65) Prior Publication Data

US 2016/0211873 A1 Jul. 21, 2016

Related U.S. Application Data

(60) Provisional application No. 62/105,830, filed on Jan. 21, 2015.

(51) Int. Cl.
*H03K 9/00* (2006.01)
*H04L 27/00* (2006.01)
*H04B 1/16* (2006.01)
*H04B 1/06* (2006.01)

(52) U.S. Cl.
CPC ............... *H04B 1/16* (2013.01); *H04B 1/06* (2013.01)

(58) Field of Classification Search
None
See application file for complete search history.

(56) References Cited

U.S. PATENT DOCUMENTS

| 7,197,091 | B1* | 3/2007 | Petrov | H03D 3/007 |
| | | | | 341/118 |
| 2005/0186930 | A1 | 8/2005 | Rofougaran et al. | |
| 2006/0128340 | A1* | 6/2006 | Hsieh | H03D 7/12 |
| | | | | 455/302 |
| 2016/0261349 | A1* | 9/2016 | Chang | H04B 10/564 |

FOREIGN PATENT DOCUMENTS

EP 2 685 636 1/2014

\* cited by examiner

*Primary Examiner* — Shuwang Liu
*Assistant Examiner* — Gina McKie
(74) *Attorney, Agent, or Firm* — McClure, Qualey & Rodack, LLP

(57) ABSTRACT

A wireless receiver with high linearity, having an out-band signal bypass filter, a mixer, and a baseband circuit. The out-band signal bypass filter has a first terminal and a second terminal respectively receiving a positive differential signal and a negative differential signal from a former-stage circuit, and the out-band signal bypass filter provides an out-band signal bypass path from the first terminal to the second terminal. The mixer receives a filtered signal from the out-band signal bypass filter. The baseband circuit is coupled to the mixer for generation of an in-phase signal and a quadrature phase signal.

19 Claims, 13 Drawing Sheets

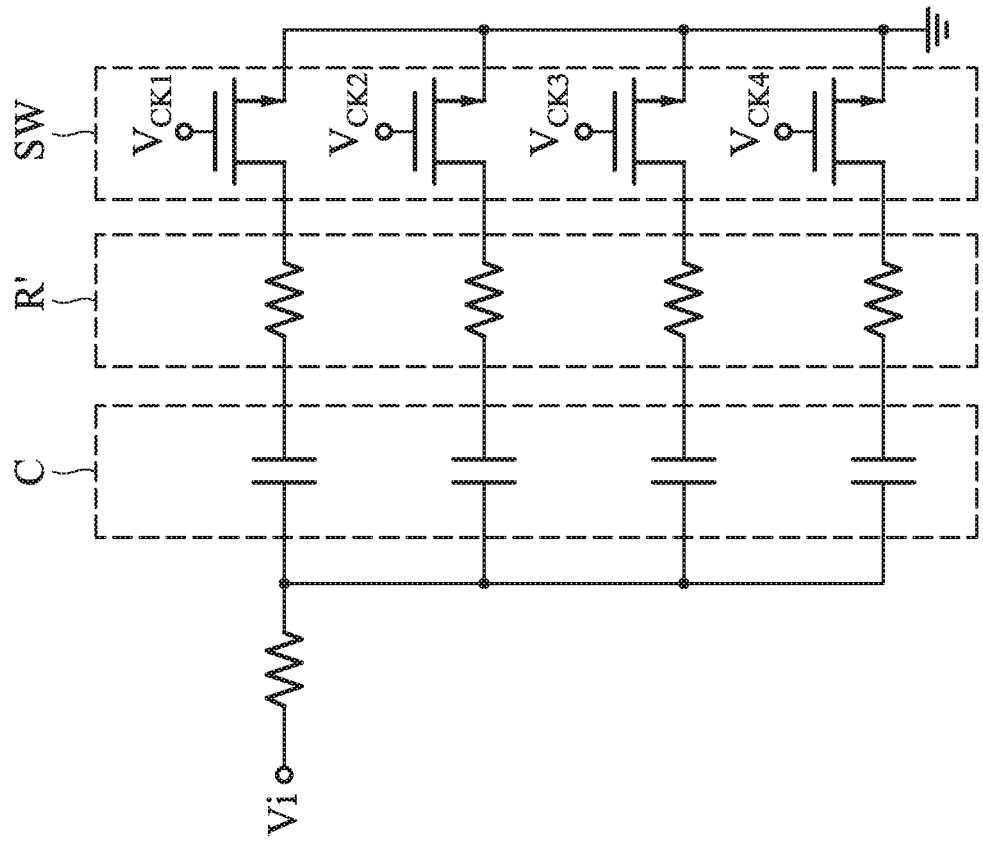
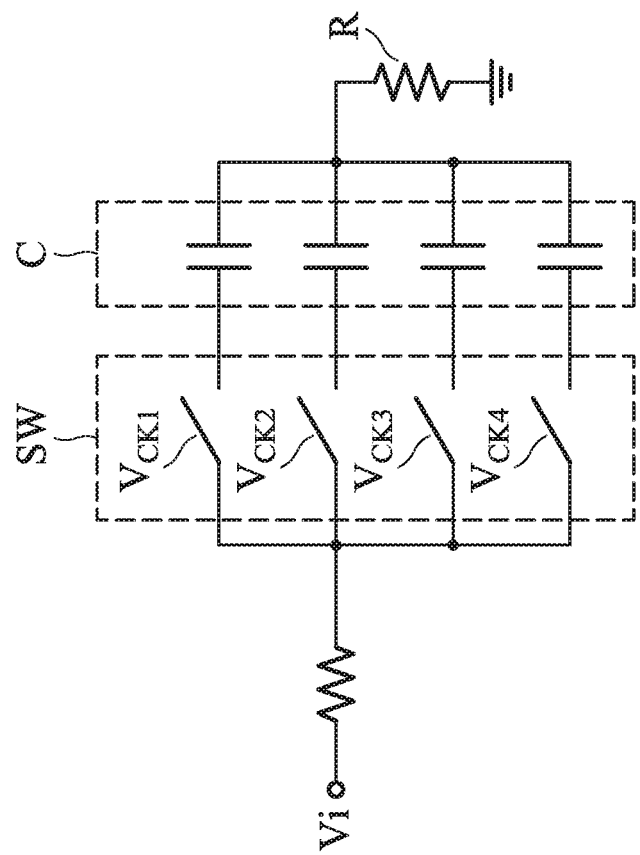
FIG. 7B
FIG. 7A

_US 9,692,471 B2_

WIRELESS RECEIVER WITH HIGH LINEARITY

CROSS REFERENCE TO RELATED APPLICATIONS

This application claims the benefit of U.S. Provisional Application No. 62/105,830, filed on Jan. 21, 2015, the entirety of which is incorporated by reference herein.

BACKGROUND OF THE INVENTION

Field of the Invention
The present invention relates to wireless receivers.
Description of the Related Art
Receiver non-linearity results in signal distortion. The non-linearity is due to current leakage by transistors (e.g. $I_{DS}$ of MOSs), charge injection, and so on.
A high linearity receiver is called for.

BRIEF SUMMARY OF THE INVENTION

A wireless receiver with high linearity in accordance with an exemplary embodiment of the disclosure has an out-band signal bypass filter, a mixer, and a baseband circuit. The out-band signal bypass filter has a first terminal and a second terminal respectively receiving a positive differential signal and a negative differential signal from a former-stage circuit. The out-band signal bypass filter provides an out-band signal bypass path from the first terminal to the second terminal. The mixer receives a filtered signal from the out-band signal bypass filter. The baseband circuit is coupled to the mixer for generation of an in-phase signal and a quadrature phase signal.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 7A shows an N-path filter with a resistor R coupled at the capacitors C;

FIG. 7B shows a variant of the N-path filter of FIG. 7A;

DETAILED DESCRIPTION OF THE INVENTION

The following description shows exemplary embodiments of carrying out the invention. This description is made for the purpose of illustrating the general principles of the invention and should not be taken in a limiting sense. The scope of the invention is best determined by reference to the appended claims.

Figure 1:
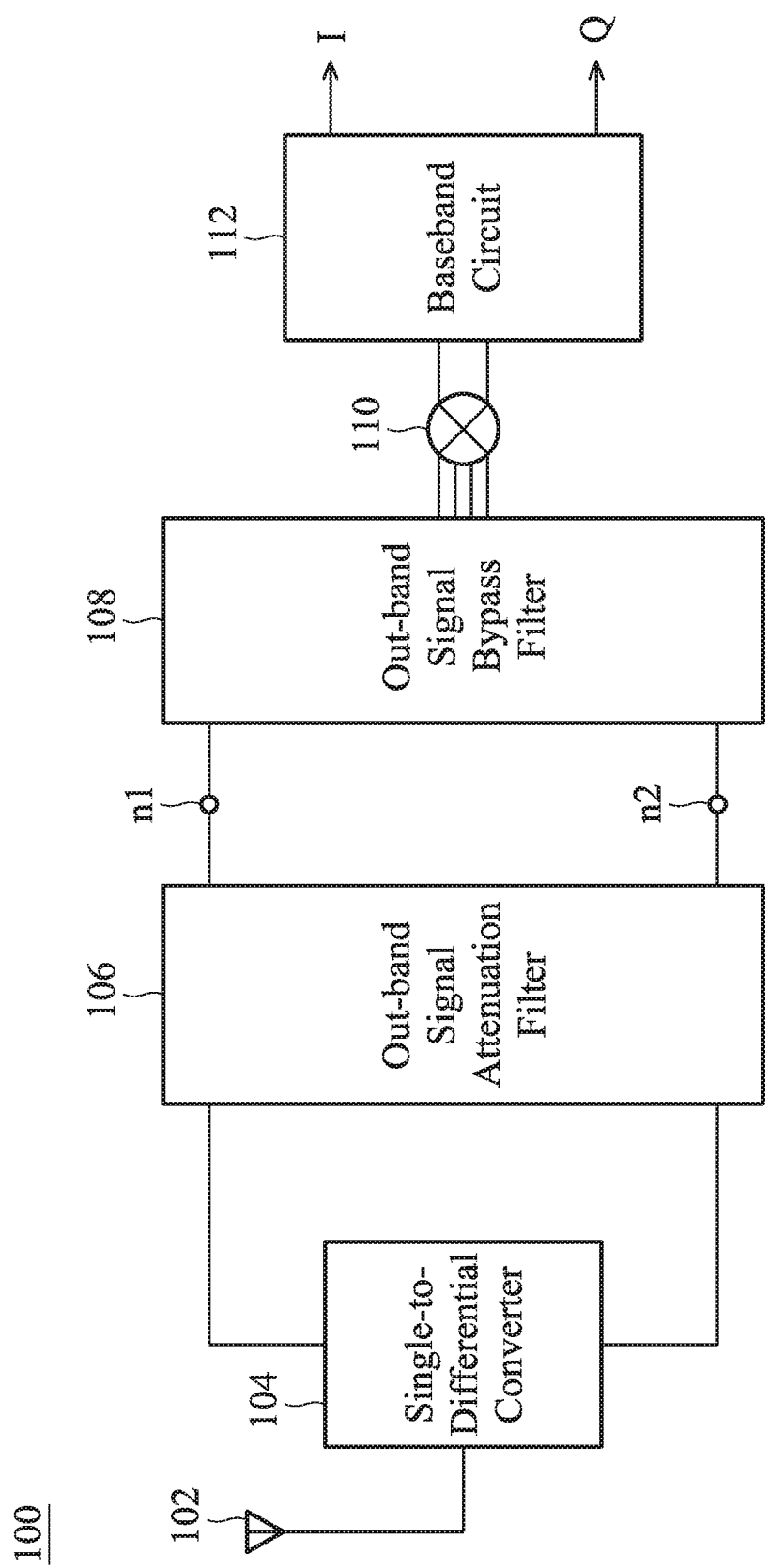
FIG. 1 is a block diagram depicting a wireless receiver 100 in accordance with an exemplary embodiment of the disclosure.

FIG. 1 is a block diagram depicting a wireless receiver 100 in accordance with an exemplary embodiment of the disclosure. The wireless receiver 100 comprises an antenna 102, a single-to-differential converter 104, an out-band signal attenuation filter 106, an out-band signal bypass filter 108, mixer 110 and a baseband circuit 112. The antenna 102 receives radio waves. The single-to-differential converter 104 is coupled between the antenna 102 and the out-band signal attenuation filter 106 for a single-to-differential conversion. The out-band signal attenuation filter 106 is a former-stage circuit with respect to the out-band signal bypass filter 108. The out-band signal bypass filter 108 has a first terminal n1 and a second terminal n2 respectively receiving a positive differential signal and a negative differential signal from the out-band signal attenuation filter 106, and provides an out-band signal bypass path from the first terminal n1 to the second terminal n2. The mixer 110 receives a filtered signal from the out-band signal bypass filter 108. The baseband circuit 112 is coupled to the mixer 110 for generation of an in-phase signal I and a quadrature phase signal Q. Because of the out-band signal bypass path provided by the out-band signal bypass filter 108, out-band signals are successfully suppressed and the linearity of the wireless receiver 100 is improved considerably.

Figure 2:
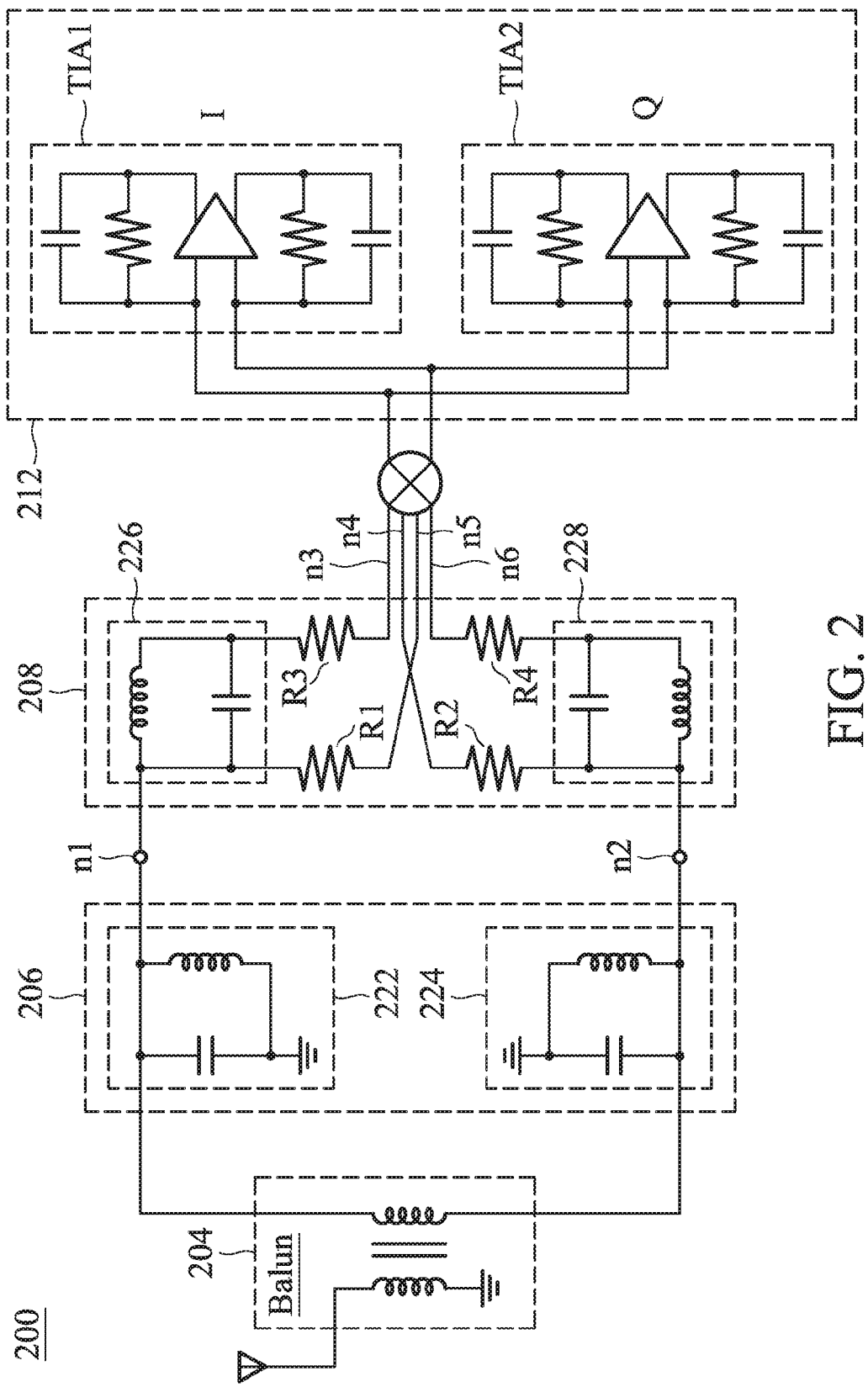
FIG. 2 is a wireless receiver 200 in accordance with another exemplary embodiment of the disclosure.

FIG. 2 is a wireless receiver 200 in accordance with another exemplary embodiment of the disclosure. With respect to the wireless receiver 100 of FIG. 1, the wireless receiver uses a Balun transformer 204 (not intended to limit thereto) as the single-to-differential converter 104. With respect to the out-band signal attenuation filter 106, the out-band signal attenuation filter 206 uses an LC tank 222 in the positive differential path and an LC tank 224 in the negative differential path to attenuate out-band signals. With respect to the out-band signal bypass filter 108, the out-band signal bypass filter 208 uses an LC tank 226 and resistors R1 and R3 in the positive differential path and an LC tank 228 and resistors R2 and R4 in the negative differential path to establish the out-band signal bypass path. In addition to the first terminal n1 and the second terminal n2, the out-band signal bypass filter 208 further uses a third terminal n3, a fourth terminal n4, a fifth terminal n5 and a sixth terminal n6 coupled to the mixer. With respect to the baseband circuit 112, the baseband circuit 212 uses two baseband transimpedance amplifiers (baseband TIAs) TIA1 and TIA2 to respectively generate the in-phase signal I and the quadrature signal Q.

Figure 3A:
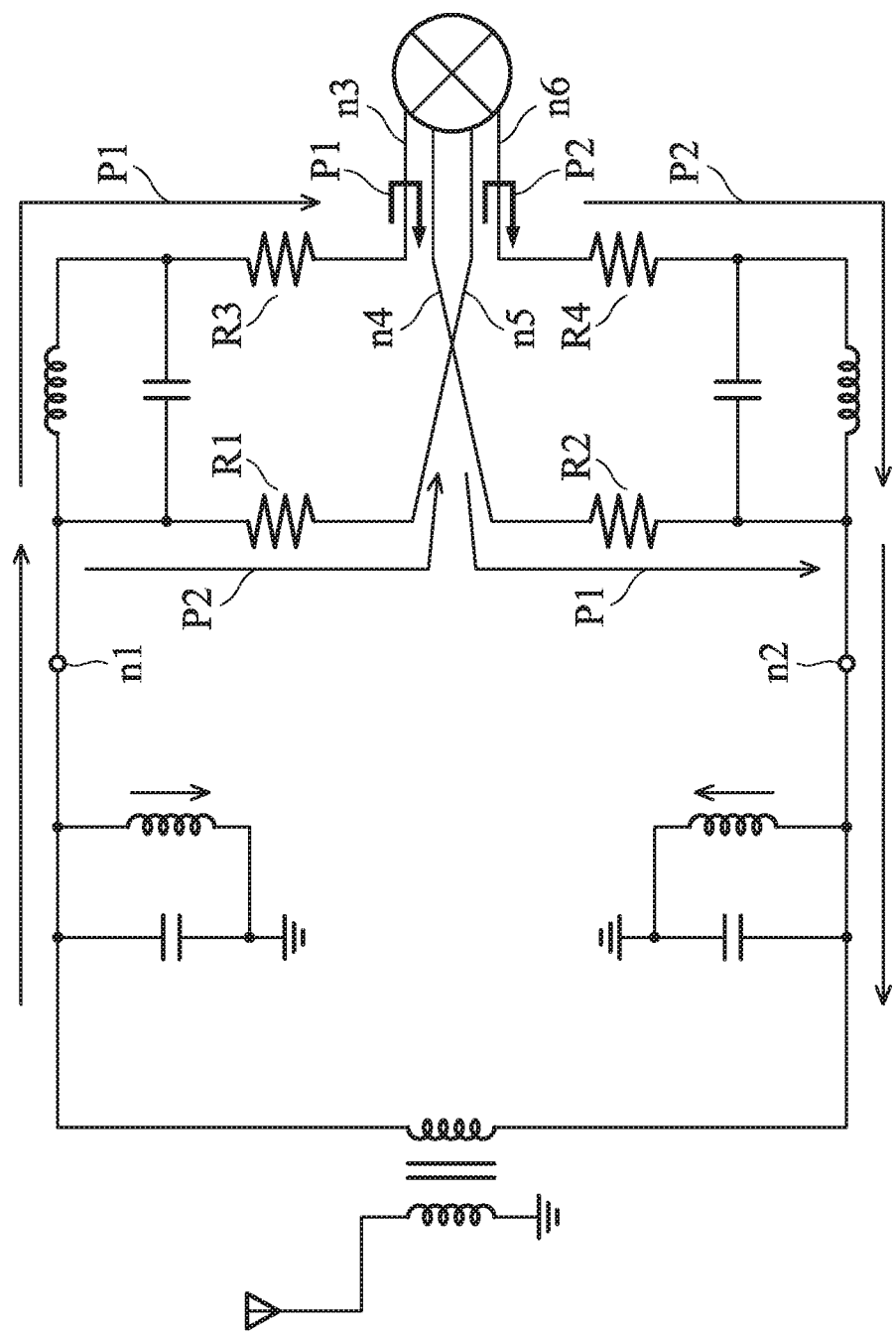
FIG. 3A shows the signal path in the wireless receiver 200 for the out-band signals.

FIG. 3A shows the signal path in the wireless receiver 200 for the out-band signals. For out-band signals, the LC tanks are short circuits (or with low impedance). As shown, the out-band signal bypass path is established, which includes a first branch P1 and a second branch P2. The first branch P1 is from the first terminal n1 to the third terminal n3 (through an inductor and the resistor R3) to the mixer and back to the out-band signal bypass filter via the fourth terminal n4 and from the fourth terminal n4 to the second terminal n2 (through the resistor R2). The second branch P2 is from the first terminal n1 to the fifth terminal n5 (through the resistor R1) to the mixer and back to the out-band signal bypass filter via the sixth terminal n6 and from the sixth terminal n6 to the second terminal n2 (through the resistor R4 and an inductor). The out-band signals are not conveyed further to the baseband circuit 212.

Figure 3B:
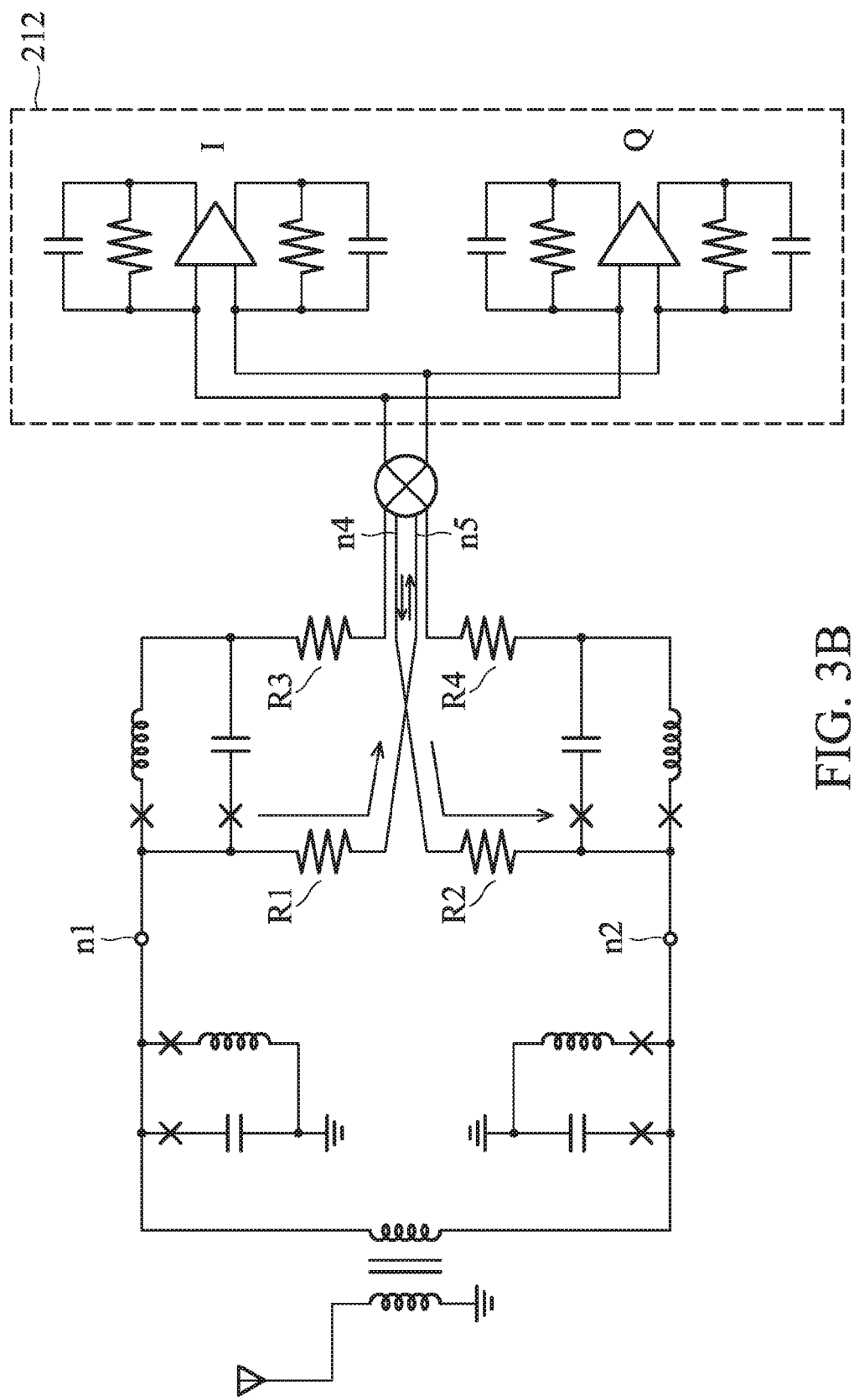
FIG. 3B shows the signal path in the wireless receiver 200 for the in-band signals.

FIG. 3B shows the signal path in the wireless receiver 200 for the in-band signals. For in-band signals, the LC tanks are open circuits (i.e. with high impedance). As shown, the resistor R1 coupled between the first terminal n1 and the fifth terminal n5 and the resistor R2 coupled between the fourth terminal n4 and the second terminal n2 are provided for voltage-to-current conversion of in-band signals. The in-band signals, thereby, are delivered to the mixer and the baseband circuit 212 to be transformed to the in-phase signal I and the quadrature signal Q.

Figure 4A:
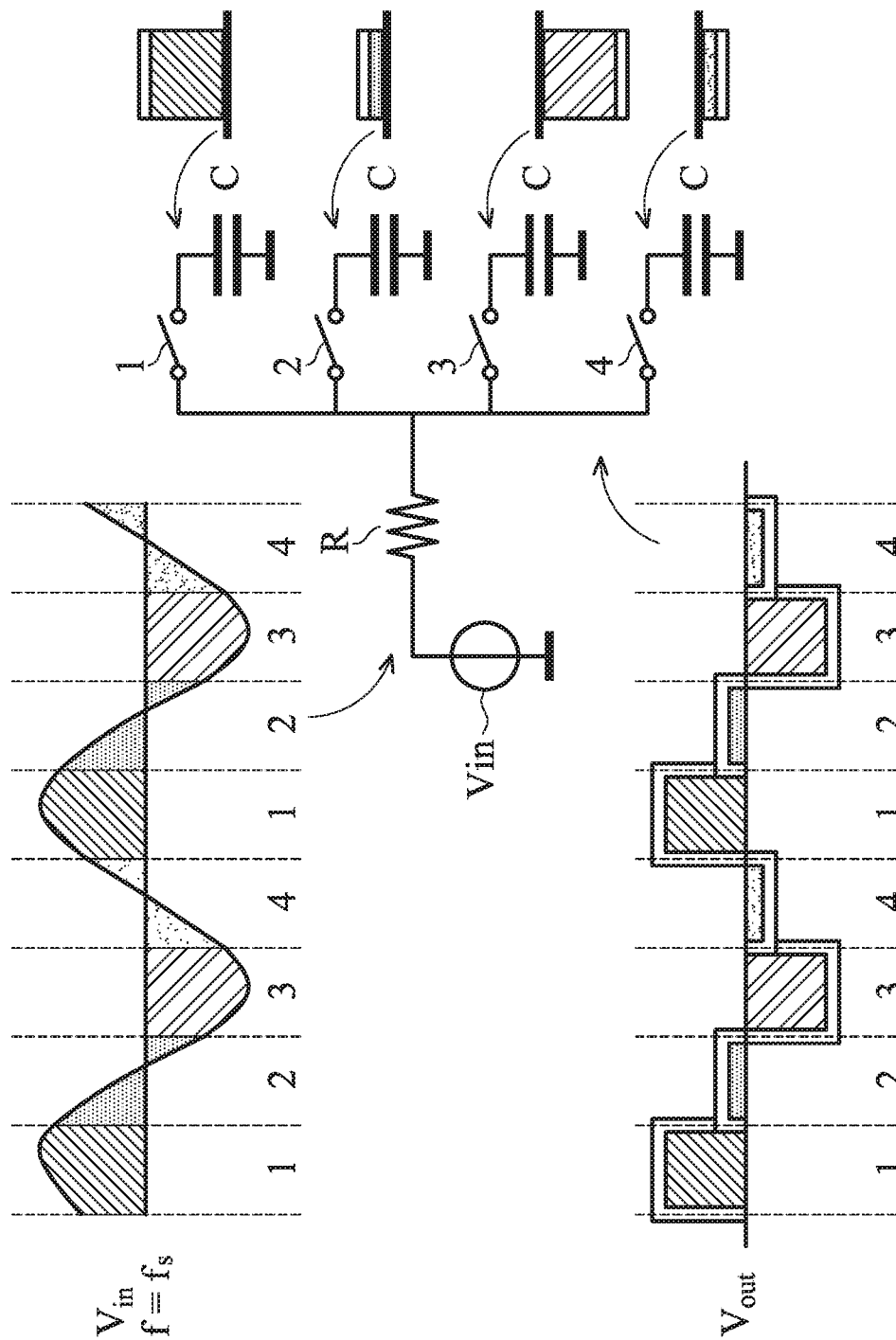
FIG. 4A shows how an in-band signal is processed by an N-path filter.
Figure 4B:
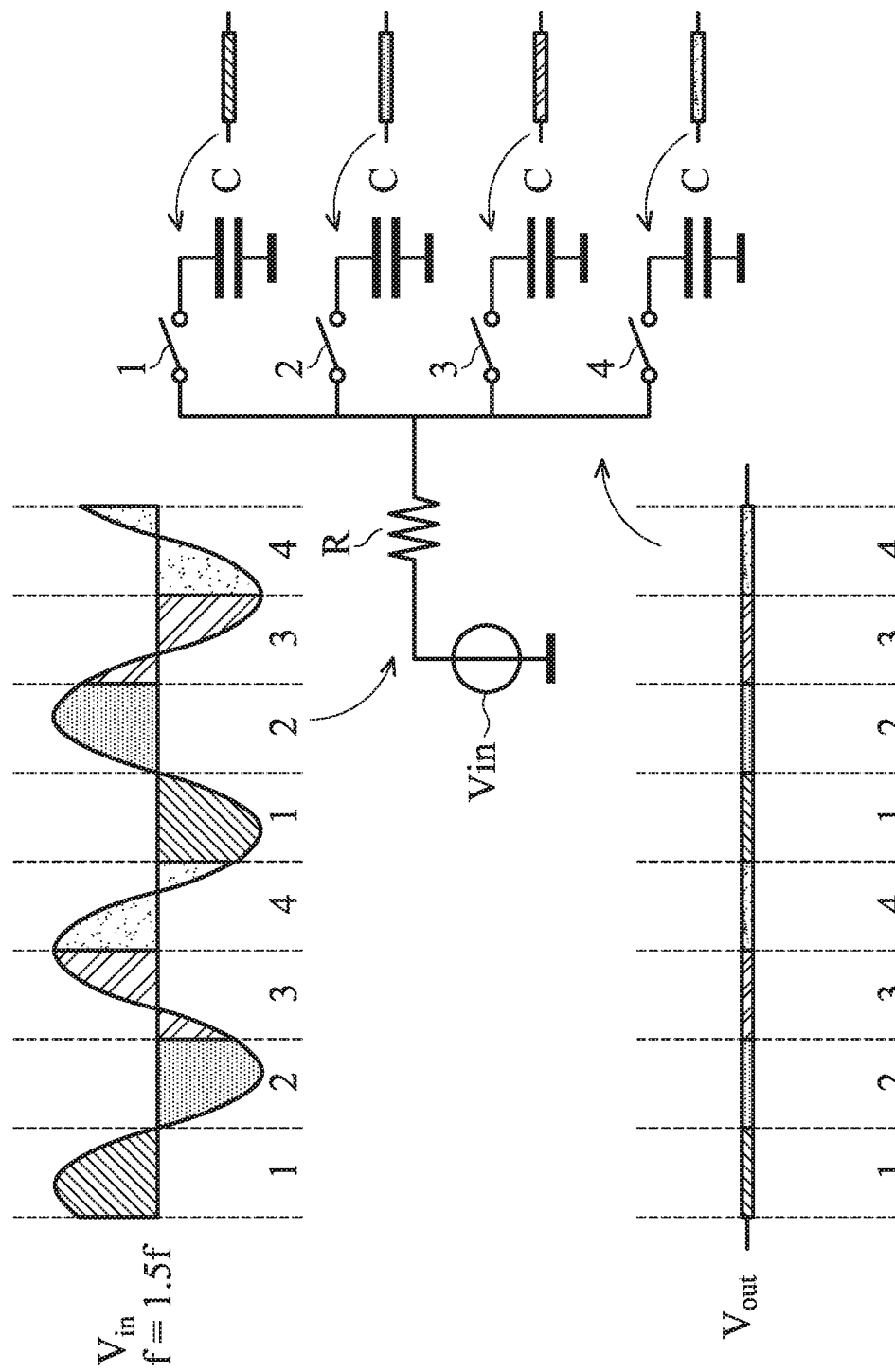
FIG. 4B shows how an out-band signal is processed by an N-path filter.

The LC tanks 222, 224, 226 and 228 may be replaced by N-path filters. An N-path filter includes MOS switches and capacitors. FIG. 4A shows how an in-band signal is processed by an N-path filter and FIG. 4B shows how an out-band signal is processed by an N-path filter. The switches are turned on by rotation. As shown, the switches are turned on during the different duty periods '1' to '4'. In FIG. 4A, the input signal Vin resonating at the sampling rate (i.e., f=fs) is an in-band signal, which is captured by the capacitors C with low distortion. The filtered output Vout almost follows the input signal Vin. In FIG. 4B, the input signal Vin not resonating at the sampling rate (as shown, f=1.5fs) as an out-band signal is ideally filtered and not shown in the filtered output Vout.

Figure 5:
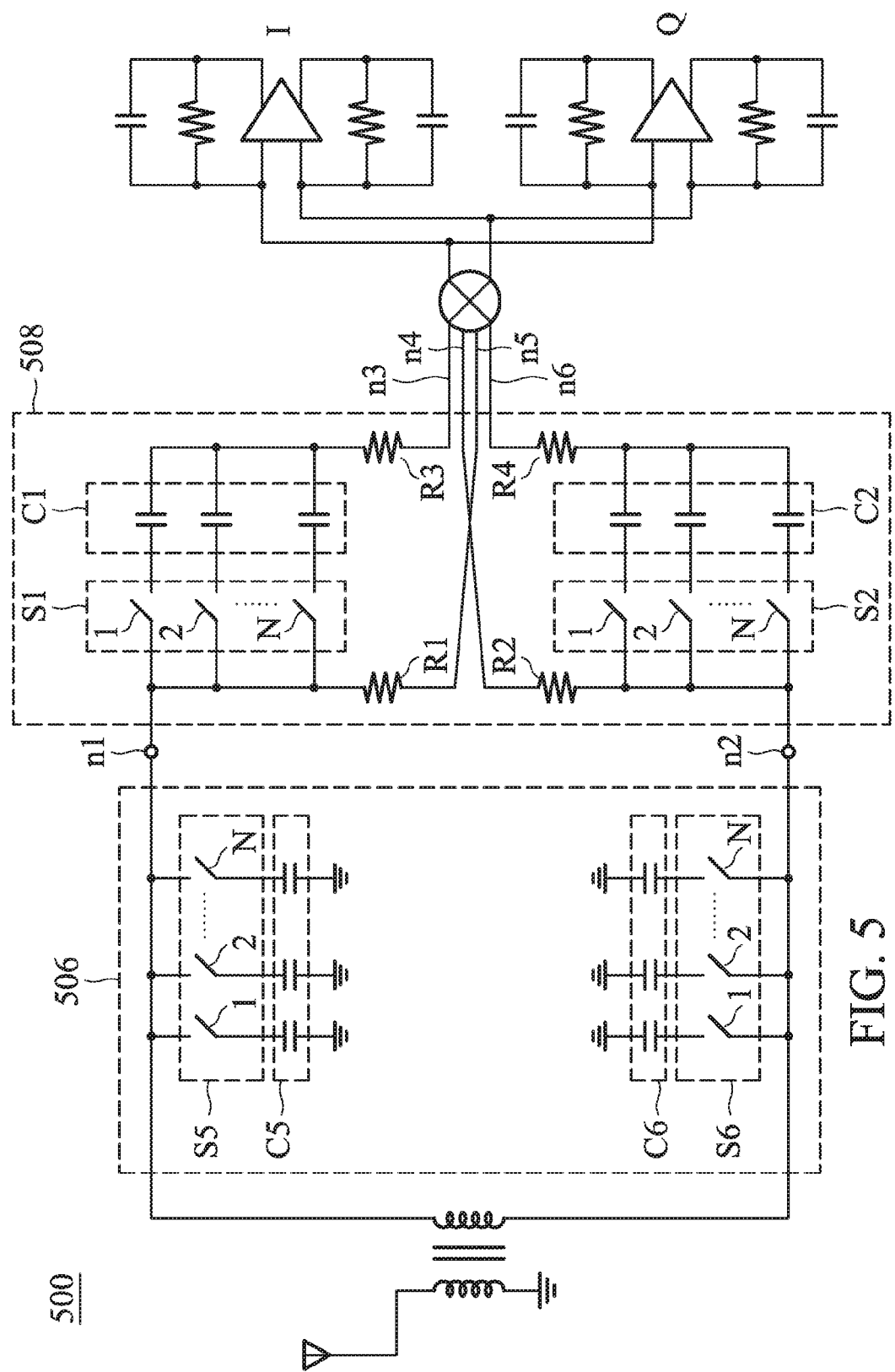
FIG. 5 is a wireless receiver 500 in accordance with another exemplary embodiment of the disclosure.

FIG. 5 is a wireless receiver 500 in accordance with another exemplary embodiment of the disclosure.

With respect to the out-band signal bypass filter 108, the out-band signal bypass filter 508 comprises resistors R1, R2, R3 and R4, a plurality of switches S1, a plurality of switches S2, a plurality of capacitors C1, and a plurality of capacitors C2. The resistor R1 is coupled between the first terminal n1 and the fifth terminal n5 of the out-band signal bypass filter 508. The resistor R2 is coupled between the fourth terminal n4 and the second terminal n2 of the out-band signal bypass filter 508. The first terminal n1 of the out-band signal bypass filter is coupled to the capacitors C1 by the respective switches S1. The capacitors C1 are coupled to the third terminal n3 of the out-band signal bypass filter 508 by the resistor R3. The sixth terminal n6 of the out-band signal bypass filter 508 is coupled to the capacitors C2 by the resistor R4. The capacitors C2 are coupled to the second terminal n2 of the out-band signal bypass filter 508 by the respective switches S2. The switches S1 may be turned on by rotation, and the switches S2 are turned on by rotation. As shown in FIG. 5, the switches S1 and the switches S2 are turned on during the differential duty periods '1' to 'N'.

With respect to the out-band signal attenuation filter 106, the out-band signal attenuation filter 506 comprises a plurality of switches S5, a plurality of switches S6, a plurality of capacitors C5, and a plurality of capacitors C6. The capacitors C5 are coupled to the first terminal n1 of the out-band signal bypass filter 508 by the respective switches S5. The capacitors C6 are coupled to the second terminal n2 of the out-band signal bypass filter 508 by the respective switches S6. The switches S5 are turned on by rotation, and the switches S6 are turned on by rotation. As shown in FIG. 5, the switches S5 and the switches S6 are turned on during the differential duty periods '1' to 'N'.

Figure 6A:
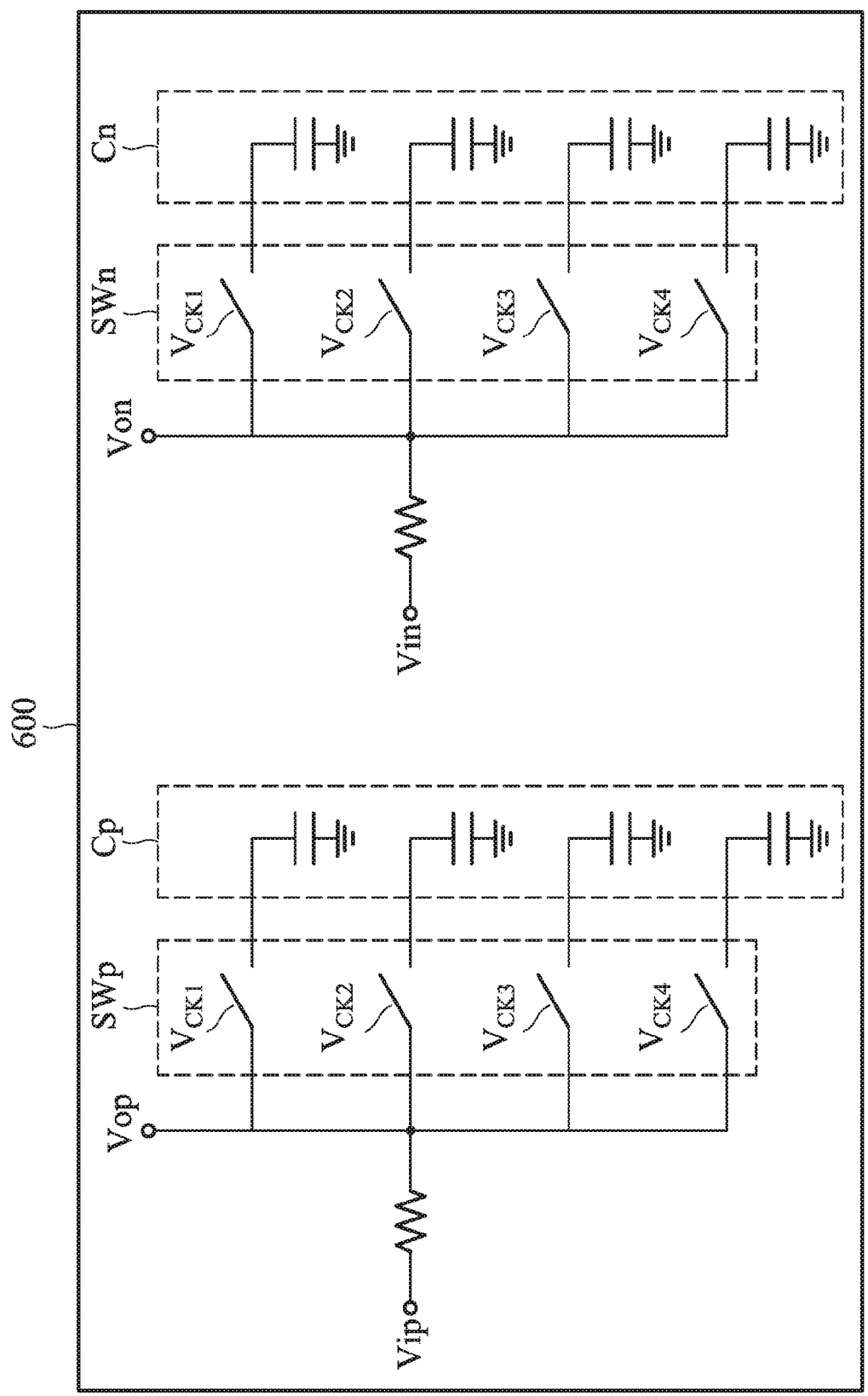
FIG. 6A shows an N-path filter 600 in a differential architecture.
Figure 6B:
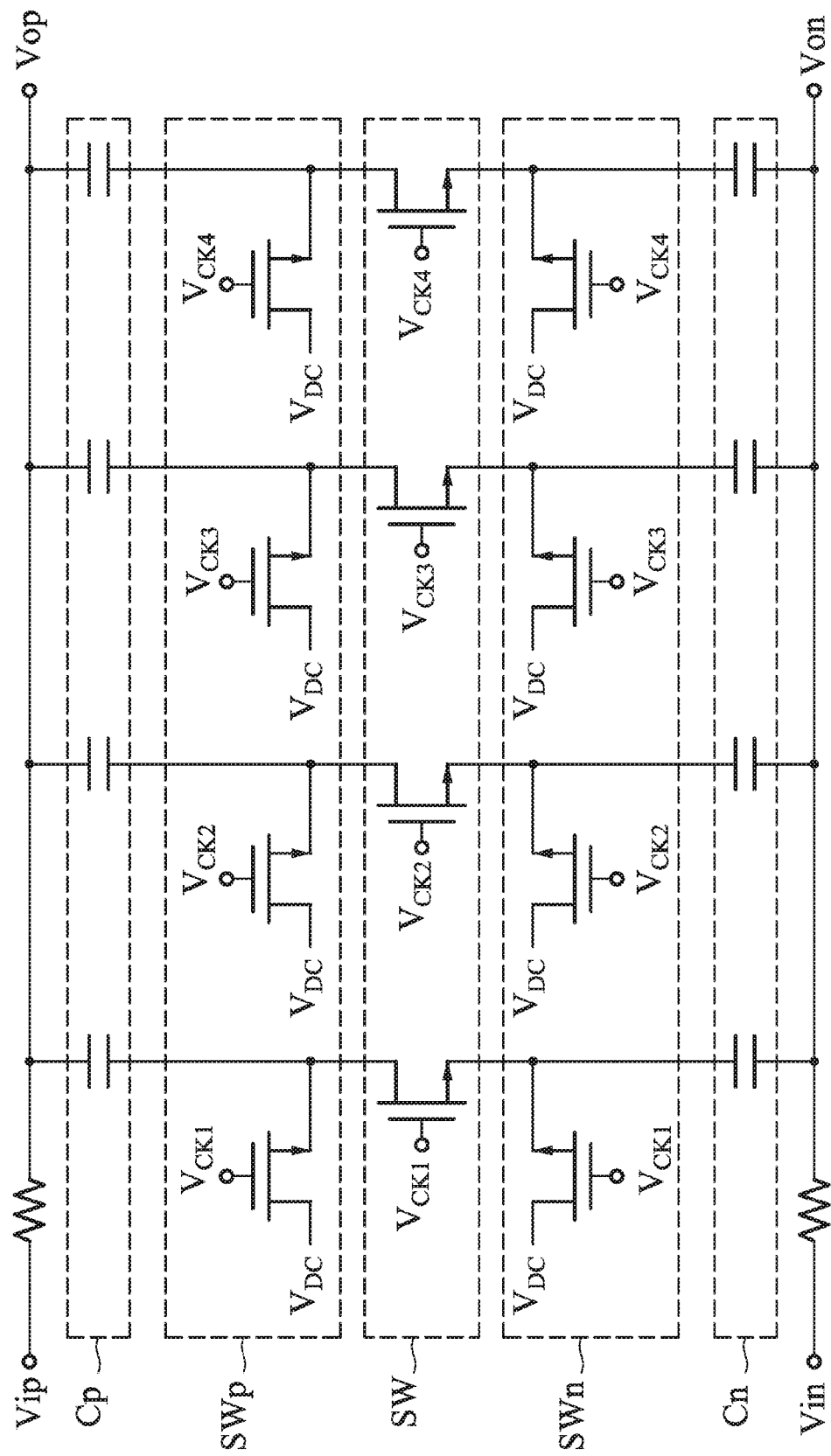
FIG. 6B shows a variant of the N-path filter of FIG. 6A.

FIG. 6A shows an N-path filter 600 in a differential architecture and FIG. 6B shows a variant of the N-path filter of FIG. 6A. In FIG. 6A, the input signal Vip/Vin is first coupled to the switches SWp/SWn (turned on according to the different clocks $V_{CK1} \ldots V_{CK4}$) and then coupled to the capacitors Cp/Cn. In FIG. 6B, the capacitors Cp/Cn are moved to closer to the input signal Vip/Vin than the switches SWp/SWn. The switches SWp and SWn are further coupled to a common mode voltage VDC. The N-path filter of FIG. 6B further comprises a plurality of switches SW which are also turned on according to the different clocks $V_{CK1} \ldots V_{CK4}$. The capacitors Cp and the capacitors Cn are coupled in series by the switches SW. In the N-path filter of FIG. 6B, the signal swing across the switches SWp/SWn is much smaller than that of FIG. 6A and the linearity is better without raising the issues of reliability and ESD.

FIG. 7A shows an N-path filter with a resistor R coupled at the capacitors C and FIG. 7B shows a variant of the N-path filter of FIG. 7A. In FIG. 7A, the input signal Vi is coupled to the capacitors C by the switches SW (turned on according to the different clocks $V_{CK1} \ldots V_{CK4}$). In FIG. 7B, the positions of the capacitors C and the switches SW are exchanged, and the resistor R of FIG. 7A is changed to a plurality of resistors R' and moved to closer to the input signal Vi than the switches SW. In the N-path filter of FIG. 7B, the signal swing across the switches SW is much smaller than that of FIG. 7A and the linearity is better without raising the issues of reliability and ESD.

Figure 8A:
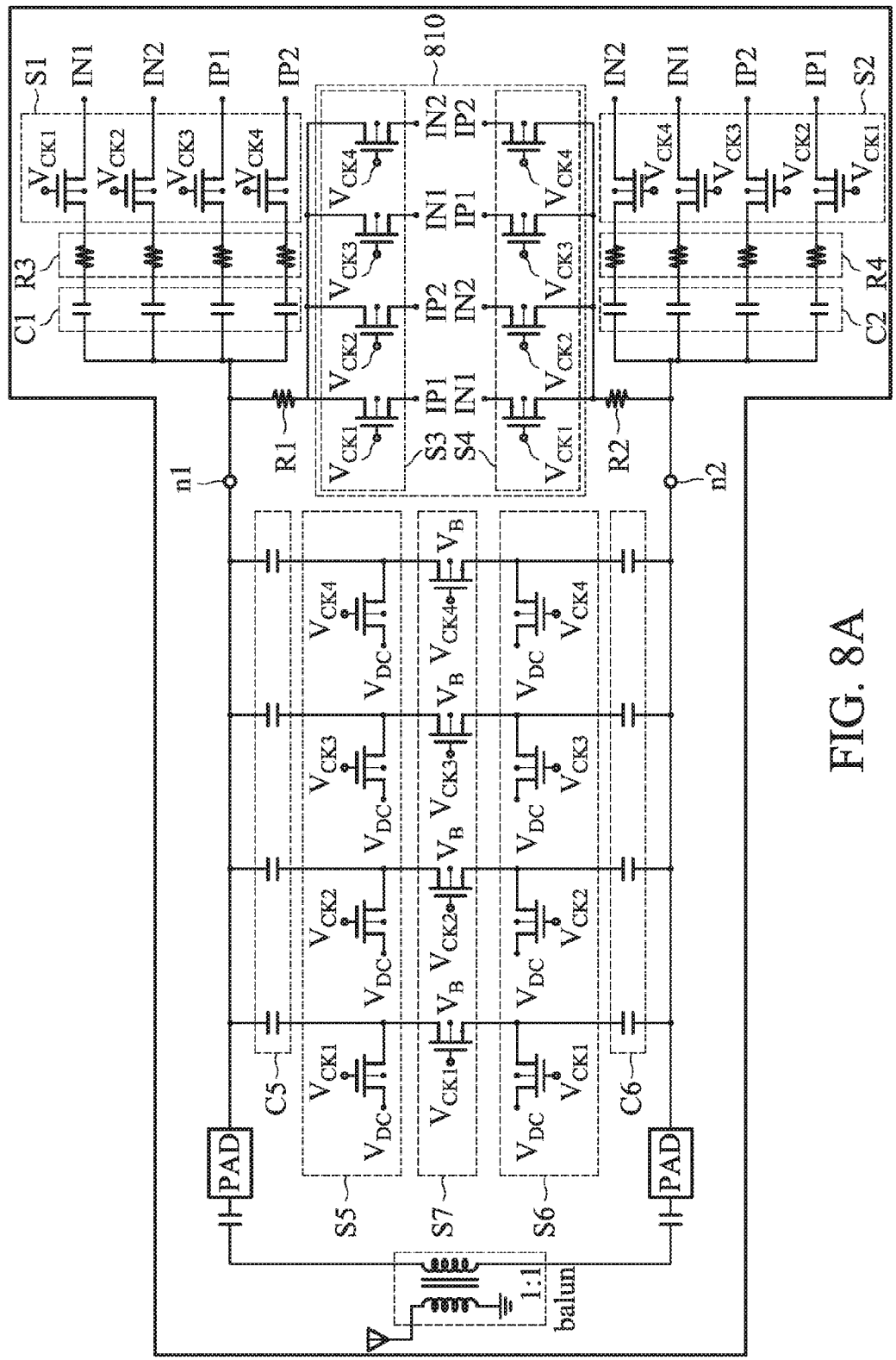
FIG. 8A depicts a wireless receiver which uses the N-path filter of FIG. 6B as the out-band signal attenuation filter 106 and the N-path filter of FIG. 7B as the out-band signal bypass filter 108 of FIG. 1.
Figure 8B:
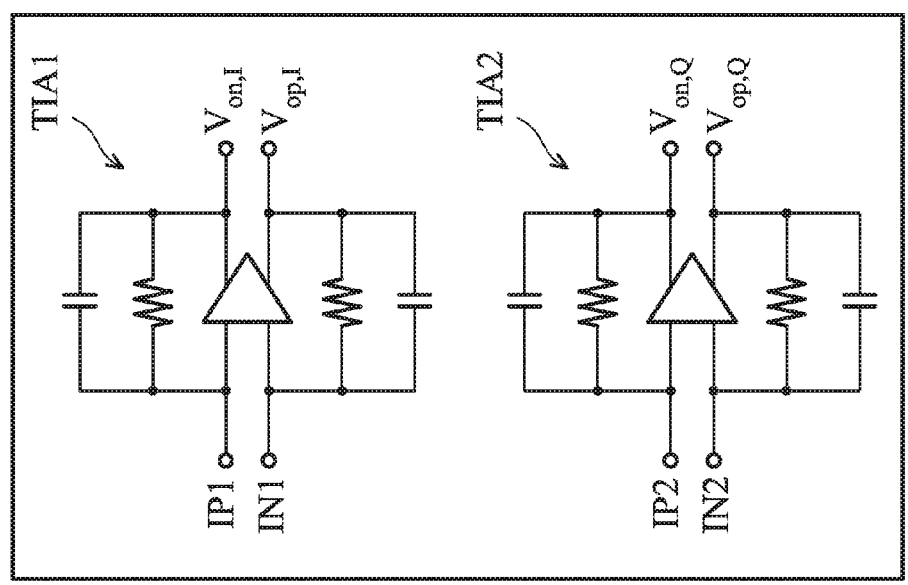
FIG. 8B also depicts a wireless receiver which uses the N-path filter of FIG. 6B as the out-band signal attenuation filter 106 and the N-path filter of FIG. 7B as the out-band signal bypass filter 108 of FIG. 1.

FIG. 8A and FIG. 8B depict a wireless receiver. As shown in FIG. 8A, the N-path filter of FIG. 6B is implemented as the out-band signal attenuation filter 106 and the N-path filter of FIG. 7B is implemented as the out-band signal bypass filter 108 of FIG. 1. The baseband circuit is shown in FIG. 8B.

The out-band signal attenuation filter in FIG. 8A comprises a plurality of capacitors C5, a plurality of capacitors C6, a plurality of switches S5, a plurality of switches S6, and a plurality of switches S7. The switches S5 correspond to the capacitors C5 one by one. The switches S6 correspond to the capacitors C6 one by one. The switches S7 correspond to the switches S5 one by one and correspond to the switches S6 one by one. Each capacitor C5 is coupled between the corresponding switch S5 and the first terminal n1 of the out-band signal bypass filter, and is coupled to a dc voltage level $V_{DC}$ by the corresponding switch S5. Each capacitor C6 is coupled between the corresponding switch S6 and the second terminal n2 of the out-band signal bypass filter, and is coupled to the dc voltage level $V_{DC}$ by the corresponding switch S6. The capacitors C5 are coupled to the capacitors C6 by the respective switches S7. According to the clocks $V_{CK1} \ldots V_{CK4}$, the switches S5 may be turned on by rotation, the switches S6 may be turned on by rotation, and switches S7 may be turned on by rotation. Each switch S7 is turned on with the corresponding switch S5 and the corresponding switch S6.

The out-band signal bypass filter in FIG. 8A comprises resistors R1 and R2, a plurality of resistors R3, a plurality of resistors R4, a plurality of capacitors C1, a plurality of and C2, a plurality of switches S1, and a plurality of switches S2. The resistor R1 couples the first terminal n1 of the out-band signal bypass filter to the mixer 810. The resistors R3 correspond to the capacitors C1 one by one. The switches S1 correspond to the capacitors C1 one by one. The resistor R2 couples the second terminal n2 of the out-band signal bypass filter to the mixer 810. The resistors R4 correspond to the capacitors C2 one by one. The switches S2 correspond to the capacitors C2 one by one. Each capacitor C1 and the corresponding resistor R3 are coupled in series between the first terminal n1 of the out-band signal bypass filter and the corresponding switch S1 and are coupled to the mixer 810 by the corresponding switch S1. Each capacitor C2 and the corresponding resistor R4 are coupled in series between the second terminal n2 of the out-band signal bypass filter and the corresponding switch S2 and are coupled to the mixer 810 by the corresponding switch S2. According to the clocks $V_{CK1} \ldots V_{CK4}$, the switches S1 are turned on by rotation and the switches S2 are turned on by rotation.

The mixer 810 of FIG. 8A provides a plurality of mixer connection points IP1, IP2, IN1 and IN2 and further comprises a plurality of switches S3 and a plurality of switches S4. The switches S3 couple the resistor R1 to the mixer connection points IP1, IP2, IN1 and IN2 one by one. The switches S4 couple the resistor R2 to the mixer connection points IP1, IP2, IN1 and IN2 one by one. The switches S1 of the out-band signal bypass filter are coupled to the mixer 810 via the mixer connection points IP1, IP2, IN1 and IN2. The switches S2 of the out-band signal bypass filter are coupled to the mixer 810 via the mixer connection points IN1, IN2, IP1 and IP2. According to the clocks $V_{CK1} \ldots V_{CK4}$, the switches S3 are turned on by rotation and the switches S4 are turned on by rotation.

The baseband circuit in FIG. 8B comprises a first baseband transimpedance amplifier TIA1 having a first positive input terminal coupled to the mixer connection point IP1 and a first negative input terminal coupled to the mixer connection point IN1, and a second baseband transimpedance amplifier TIA2 having a second positive input terminal coupled to the mixer connection point IP2 and a second negative input terminal coupled to the mixer connection point IN2.

The switches S1, S2, S3 and S4 of FIG. 8A are discussed in this paragraph. The switch S1 coupled to the mixer connection point IN1, the switch S2 coupled to the mixer connection point IP1, the switch S3 coupled to the mixer connection point IP1 and the switch S4 coupled to the mixer connection point IN1 are controlled by a clock $V_{CK1}$. The switch S1 coupled to the mixer connection point IN2, the switch S2 coupled to the mixer connection point IP2, the switch S3 coupled to the mixer connection point IP2 and the switch S4 coupled to the mixer connection point IN2 are controlled by a clock $V_{CK2}$. The switch S1 coupled to the mixer connection point IP1, the switch S2 coupled to the mixer connection point IN1, the switch S3 coupled to the mixer connection point IN1 the switch S4 coupled to the mixer connection point IP1 are controlled by a clock $V_{CK3}$. The switch S1 coupled to the mixer connection point IP2, the switch S2 coupled to the mixer connection point IN2, the switch S3 coupled to the mixer connection point IN2, and the switch S4 coupled to the mixer connection point IP2 are controlled by a clock $V_{CK4}$. The clocks $V_{CK1}$ to $V_{CK4}$ turn on alternately. The clock $V_{CK1}$ leads the clock $V_{CK2}$. The clock $V_{CK2}$ leads the clock $V_{CK3}$. The clock $V_{CK3}$ leads the clock $V_{CK4}$.

Figure 9:
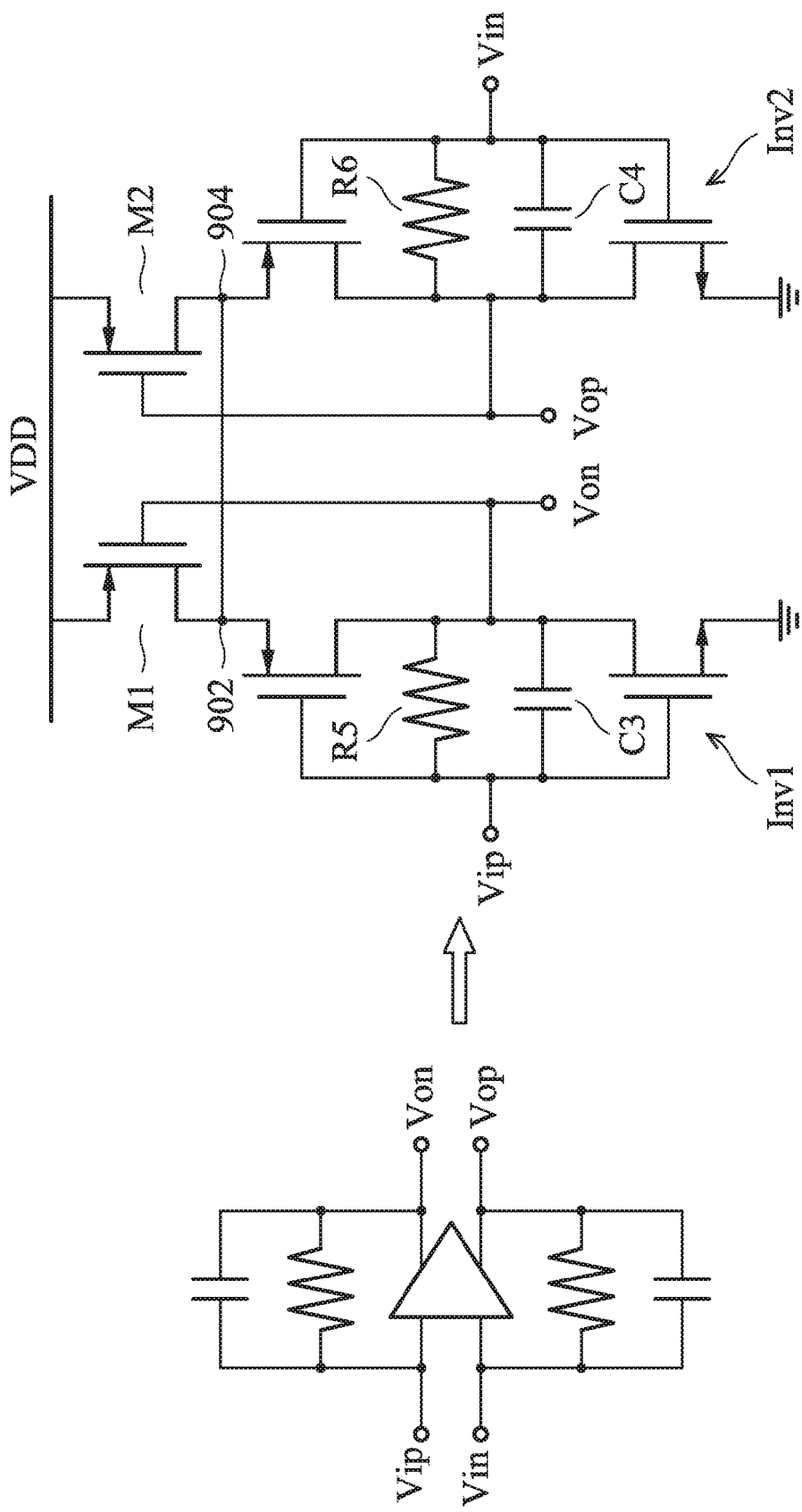
FIG. 9 depicts the baseband transimpedance amplifier TIA1/TIA2 in detail.

FIG. 9 depicts the baseband transimpedance amplifier TIA1/TIA2 in detail. A baseband transimpedance amplifier TIA1/TIA2 comprises a first inverter Inv1, a second inverter Inv2, a first transistor M1, a second transistor M2, resistors R5 and R6, and capacitors C3 and C4. The first inverter Inv1 has a power terminal 902 coupled to a power line VDD by the first transistor M1, the second inverter Inv2 has a power terminal 904 coupled to the power line VDD by the second transistor M2. The power terminal 902 of the first inverter Inv1 is coupled to the power terminal 904 of the second inverter Inv2. The first transistor M1 has a gate coupled to an output terminal Von of the first inverter Inv1. The second transistor M2 has a gate coupled to an output terminal Vop of the second inverter Inv2. The resistor R5 and the capacitor C3 are connected in parallel between an input terminal Vip and the output terminal Von of the first inverter Inv1. The resistor R6 and the capacitor C4 are connected in parallel between an input terminal Vin and the output terminal Vop of the second inverter Inv2. The baseband transimpedance amplifier is in a common mode feedback architecture with large differential gain and low common mode voltage gain.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A wireless receiver, comprising:
    an out-band signal bypass filter, having a first terminal and a second terminal respectively receiving a positive differential signal and a negative differential signal from a former-stage circuit, wherein the out-band signal bypass filter provides an out-band signal bypass path from the first terminal to the second terminal;
    a mixer, receiving a filtered signal from the out-band signal bypass filter; and
    a baseband circuit, coupled to the mixer for generation of an in-phase signal and a quadrature phase signal,
    wherein:
    the out-band signal bypass filter further comprises a third terminal, a fourth terminal, a fifth terminal and a sixth terminal coupled to the mixer; and
    the out-band signal bypass path includes a first branch from the first terminal to the third terminal to the mixer and back to the out-band signal bypass filter via the fourth terminal and from the fourth terminal to the second terminal, and a second branch from the first terminal to the fifth terminal to the mixer and back to the out-band signal bypass filter via the sixth terminal and from the sixth terminal to the second terminal.

2. The wireless receiver as claimed in claim 1, wherein:
    the out-band signal bypass filter further comprises a first resistor coupled between the first terminal and the fifth terminal and a second resistor coupled between the fourth terminal and the second terminal, for voltage-to-current conversion of in-band signals.

3. The wireless receiver as claimed in claim 2, wherein the out-band signal bypass filter comprises:
    a plurality of first switches, a plurality of first capacitors and a third resistor; and
    a plurality of second switches, a plurality of second capacitors and a fourth resistor,
    wherein:
    the first terminal of the out-band signal bypass filter is coupled to the first capacitors by the respective first switches;
    the first capacitors are coupled to the third terminal of the out-band signal bypass filter by the third resistor;
    the sixth terminal of the out-band signal bypass filter is coupled to the second capacitors by the fourth resistor; and the second capacitors are coupled to the second terminal of the out-band signal bypass filter by the respective second switches.

4. The wireless receiver as claimed in claim 3, wherein:
the first switches are turned on by rotation; and
the second switches are turned on by rotation.

5. The wireless receiver as claimed in claim 1, wherein the out-band signal bypass filter comprises:
a first resistor, coupling the first terminal of the out-band signal bypass filter to the mixer;
a plurality of first capacitors and a plurality of third resistors, the third resistors corresponding to the respective first capacitors;
a plurality of first switches, the first switches corresponding to the respective first capacitors;
a second resistor, coupling the second terminal of the out-band signal bypass filter to the mixer;
a plurality of second capacitors and a plurality of fourth resistors, the fourth resistors corresponding to the respective second capacitors;
a plurality of second switches, the second switches corresponding to the respective second capacitors;
wherein:
each first capacitor and the corresponding third resistor are coupled in series between the first terminal of the out-band signal bypass filter and the corresponding first switch and are coupled to the mixer by the corresponding first switch; and
each second capacitor and the corresponding fourth resistor are coupled in series between the second terminal of the out-band signal bypass filter and the corresponding second switch and are coupled to the mixer by the corresponding second switch.

6. The wireless receiver as claimed in claim 5, wherein:
the first switches are turned on by rotation; and
the second switches are turned on by rotation.

7. The wireless receiver as claimed in claim 5, wherein the mixer comprises:
a plurality of mixer connection points;
a plurality of third switches, the third switches coupling the first resistor to the respective mixer connection points; and
a plurality of fourth switches, the fourth switches coupling the second resistor to the respective mixer connection points;
wherein:
the first switches of the out-band signal bypass filter are coupled to the mixer via the mixer connection points; and
the second switches of the out-band signal bypass filter are coupled to the mixer via the mixer connection points.

8. The wireless receiver as claimed in claim 7, wherein:
the third switches are turned on by rotation; and
the fourth switches are turned on by rotation.

9. The wireless receiver as claimed in claim 7, wherein:
the baseband circuit comprises a first baseband transimpedance amplifier having a first positive input terminal and a first negative input terminal, and a second baseband transimpedance amplifier having a second positive input terminal and a second negative input terminal; and
the mixer connection points are separately coupled to the first positive input terminal, first negative input terminal, second positive input terminal and second negative input terminal.

10. The wireless receiver as claimed in claim 9, wherein:
the first switch coupled to the first negative input terminal of the first baseband transimpedance amplifier is controlled by a first clock;
the first switch coupled to the second negative input terminal of the second baseband transimpedance amplifier is controlled by a second clock;
the first switch coupled to the first positive input terminal of the first baseband transimpedance amplifier is controlled by a third clock;
the first switch coupled to the second positive input terminal of the second baseband transimpedance amplifier is controlled by a fourth clock;
the second switch coupled to the first positive input terminal of the first baseband transimpedance amplifier is controlled by the first clock;
the second switch coupled to the second positive input terminal of the second baseband transimpedance amplifier is controlled by the second clock;
the second switch coupled to the first negative input terminal of the first baseband transimpedance amplifier is controlled by the third clock;
the second switch coupled to the second negative input terminal of the second baseband transimpedance amplifier is controlled by the fourth clock;
the third switch coupled to the first positive input terminal of the first baseband transimpedance amplifier is controlled by the first clock;
the third switch coupled to the second positive input terminal of the second baseband transimpedance amplifier is controlled by the second clock;
the third switch coupled to the first negative input terminal of the first baseband transimpedance amplifier is controlled by the third clock;
the third switch coupled to the second negative input terminal of the second baseband transimpedance amplifier is controlled by the fourth clock;
the fourth switch coupled to the first negative input terminal of the first baseband transimpedance amplifier is controlled by the first clock;
the fourth switch coupled to the second negative input terminal of the second baseband transimpedance amplifier is controlled by the second clock;
the fourth switch coupled to the first positive input terminal of the first baseband transimpedance amplifier is controlled by the third clock; and
the fourth switch coupled to the second positive input terminal of the second baseband transimpedance amplifier is controlled by the fourth clock.

11. The wireless receiver as claimed in claim 10, wherein:
the first clock, the second clock, the third clock and the fourth clock turn on alternately;
the first clock leads the second clock;
the second clock leads the third clock; and
the third clock leads the fourth clock.

12. The wireless receiver as claimed in claim 7, wherein the baseband circuit comprises:
a first baseband transimpedance amplifier and a second baseband transimpedance amplifier, coupled to the mixer via the mixer connection points,
wherein:
each of the first and second baseband transimpedance amplifiers comprises a first inverter, a second inverter, a first transistor and a second transistor, the first inverter has a power terminal coupled to a power line by the first transistor, the second inverter has a power terminal coupled to the power line by the second transistor, the power terminal of the first inverter is coupled to the power terminal of the second inverter, the first transistor has a gate coupled to an output terminal of the first inverter, and the second transistor has a gate coupled to an output terminal of the second inverter.

13. The wireless receiver as claimed in claim 12, wherein each of the first and second baseband transimpedance amplifiers further comprises a fifth resistor, a sixth resistor, a third capacitor and a fourth capacitor, the fifth resistor and the third capacitor are connected in parallel between an input terminal and the output terminal of the first inverter, and the sixth resistor and the fourth capacitor are connected in parallel between an input terminal and the output terminal of the second inverter.

14. The wireless receiver as claimed in claim 1, further comprising:
   an out-band signal attenuation filter, which is the former-stage circuit providing the positive differential signal and the negative differential signal to the out-band signal bypass filter.

15. The wireless receiver as claimed in claim 14, wherein the out-band signal attenuation filter comprises:
   a plurality of fifth switches;
   a plurality of fifth capacitors, wherein the fifth capacitors are coupled to the first terminal of the out-band signal bypass filter by the respective fifth switches;
   a plurality of sixth switches; and
   a plurality of sixth capacitors, wherein the sixth capacitors are coupled to the second terminal of the out-band signal bypass filter by the respective sixth switches.

16. The wireless receiver as claimed in claim 15, wherein:
   the fifth switches are turned on by rotation; and
   the sixth switches are turned on by rotation.

17. The wireless receiver as claimed in claim 14, wherein the out-band signal attenuation filter comprises:
   a plurality of fifth capacitors and a plurality of fifth switches, the fifth switches corresponding to the respective fifth capacitors;
   a plurality of sixth capacitors and a plurality of sixth switches, the sixth switches corresponding to the respective sixth capacitors; and
   a plurality of seventh switches, the seventh switches corresponding to the respective fifth switches, and corresponding to the respective sixth switches,
   wherein:
   each fifth capacitor is coupled between the corresponding fifth switch and the first terminal of the out-band signal bypass filter, and is coupled to a dc voltage level by the corresponding fifth switch;
   each sixth capacitor is coupled between the corresponding sixth switch and the second terminal of the out-band signal bypass filter, and is coupled to a terminal at the dc voltage level by the corresponding sixth switch; and
   the fifth capacitors are coupled to the sixth capacitors by the respective seventh switches.

18. The wireless receiver as claimed in claim 17, wherein:
   the fifth switches are turned on by rotation;
   the sixth switches are turned on by rotation;
   the seventh switches are turned on by rotation; and
   each seventh switch is turned on with the corresponding fifth switch and the corresponding sixth switch.

19. The wireless receiver as claimed in claim 14, further comprising:
   an antenna, receiving radio waves; and
   a single-to-differential converter, coupled between the antenna and the out-band signal attenuation filter for a single-to-differential conversion.

* * * * *